United States Patent
Della Fiora et al.

(10) Patent No.: US 9,717,158 B2
(45) Date of Patent: Jul. 25, 2017

(54) HANDLE MECHANISM

(71) Applicant: HEWLETT PACKARD ENTERPRISE DEVELOPMENT LP, Houston, TX (US)

(72) Inventors: Troy Anthony Della Fiora, Spring, TX (US); James D Preston, Houston, TX (US); Joseph Allen, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/118,855

(22) PCT Filed: Feb. 13, 2014

(86) PCT No.: PCT/US2014/016321
§ 371 (c)(1),
(2) Date: Aug. 12, 2016

(87) PCT Pub. No.: WO2015/122898
PCT Pub. Date: Aug. 20, 2015

(65) Prior Publication Data
US 2017/0055360 A1 Feb. 23, 2017

(51) Int. Cl.
*H05K 1/14* (2006.01)
*H05K 7/14* (2006.01)
(Continued)

(52) U.S. Cl.
CPC ......... *H05K 7/1487* (2013.01); *G11B 33/022* (2013.01); *G11B 33/12* (2013.01);
(Continued)

(58) Field of Classification Search
CPC ..... G11B 33/128; G11B 33/022; G11B 33/12; H05K 7/1487; H05K 7/1427; H05K 7/1449; H05K 5/0221; H05K 5/023
(Continued)

(56) References Cited

U.S. PATENT DOCUMENTS 4,426,122 A * 1/1984 Lainez ................. A62B 18/082
361/679.55
4,780,792 A 10/1988 Harris
(Continued)

FOREIGN PATENT DOCUMENTS

WO WO-2015/195144 12/2015

OTHER PUBLICATIONS

GrassValley.Com; FT Server Fault Tolerant Server Platform; http://www.grassvalley.com/docs/Manuals/servers/stratus/071-8852-01_FTserver_INSTR.pdf>.
(Continued)

*Primary Examiner* — Sherman Ng
(74) *Attorney, Agent, or Firm* — Hewlett Packard Enterprise Patent Department

(57) ABSTRACT

A system is provided herein. The system includes a cage and a handle mechanism. The handle mechanism includes a handle member and a cam member. The handle member is formed to rotate between a closed position, a top open position, and a bottom open position. In the closed position, a handle latch holds the handle in the closed position. In the top open position, the handle rotates a first amount to the top open position and engages with a top cam surface. Rotation of the handle member to rotate a cage a second amount. In the bottom open position, the handle member rotates the first amount to the bottom open position and engages with a bottom cam surface. Rotation of the handle member to rotate the cage the second amount. The cam member to control a rate of rotation of the handle member and the cage.

15 Claims, 15 Drawing Sheets

(51) Int. Cl.
  *G11B 33/12* (2006.01)
  *G11B 33/02* (2006.01)
  *H05K 5/02* (2006.01)

(52) U.S. Cl.
  CPC ........... *G11B 33/128* (2013.01); *H05K 5/023* (2013.01); *H05K 5/0221* (2013.01); *H05K 7/1427* (2013.01); *H05K 7/1449* (2013.01)

(58) Field of Classification Search
  USPC .......................................................... 361/737
  See application file for complete search history.

(56) References Cited

U.S. PATENT DOCUMENTS

| | | | |
|---|---|---|---|
| 4,850,485 A | 7/1989 | Ishikawa | |
| 5,537,268 A | 7/1996 | Felde et al. | |
| 5,912,799 A | 6/1999 | Grouell et al. | |
| 5,949,652 A | 9/1999 | McAnally | |
| 6,134,115 A | 10/2000 | Sim | |
| 6,392,884 B1 | 5/2002 | Chou | |
| 6,600,703 B1 | 7/2003 | Emberty et al. | |
| 7,029,306 B2 * | 4/2006 | Bilcauu | G06K 7/0021 439/326 |
| 7,200,008 B1 | 4/2007 | Bhugra | |
| 7,362,565 B2 | 4/2008 | Imblum | |
| 7,400,469 B2 | 7/2008 | Starr et al. | |
| 7,400,936 B2 * | 7/2008 | Chang | G06F 1/184 361/679.33 |
| 7,633,748 B2 | 12/2009 | Carlson et al. | |
| 8,009,385 B2 | 8/2011 | Starr et al. | |
| 2003/0002261 A1 | 1/2003 | Berry | |
| 2004/0047128 A1 | 3/2004 | McClelland | |
| 2006/0171110 A1 | 8/2006 | Li | |
| 2008/0030946 A1 | 2/2008 | Lee | |
| 2011/0114808 A1 * | 5/2011 | Huang | G11B 33/124 248/305 |
| 2011/0176270 A1 | 7/2011 | Chou et al. | |
| 2012/0145877 A1 | 6/2012 | Chiu | |
| 2013/0335913 A1 | 12/2013 | Brashers et al. | |
| 2013/0342990 A1 | 12/2013 | Jau | |
| 2014/0055959 A1 | 2/2014 | Manda | |
| 2014/0307400 A1 * | 10/2014 | French, Jr. | H05K 7/1427 361/755 |
| 2014/0362515 A1 * | 12/2014 | Pronozuk | H05K 7/1488 361/679.31 |
| 2015/0327414 A1 * | 11/2015 | Jau | H05K 13/0084 206/701 |

OTHER PUBLICATIONS

PCT/ISA/KR, International Search Report, Nov. 12, 2014, PCT/US2014/0163.21.

PCT/ISA/KR, International Search Report, mailed Feb. 26, 2015, PCT/US2014/043486.

* cited by examiner

HANDLE MECHANISM

BACKGROUND

Computing systems include electronic components. The electronic components are combined to form the system. The arrangement of the electronic components in a rack depends on the type of electronic components used and the space constraints of the rack and/or location of the rack.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing system designs determine requirements for components in the computing system. Space, thermal constraints, cost, and ease of use are some factors that determine the tray designs used. The type of handles that are used to access the components may be designed for use with specific components and trays.

In examples, a system is provided. The system includes a cage and a handle mechanism. The handle mechanism includes a handle member and a cam member. The handle member is formed to rotate between a closed position, a top open position, and a bottom open position. In the closed position, a handle latch holds the handle in the closed position. In the top open position, the handle rotates a first amount to a top open position and engages with a top cam surface. Rotation of the handle member to rotate a cage a second amount. In the bottom open position, the handle member rotates the first amount to a bottom open position and engages with a bottom cam surface. Rotation of the handle member to rotate the cage the second amount. The cam member to control a rate of rotation of the handle member and the cage. The handle mechanism provides access to the cage via two directions, such as top access above a tray of electronic components and bottom access below a tray of electronic components.

The phrase "electronic component" refers to a computing device such as a server, blade server, server cartridge that provides computer solutions, storage solutions, network solutions and/or cloud services.

Figure 1:
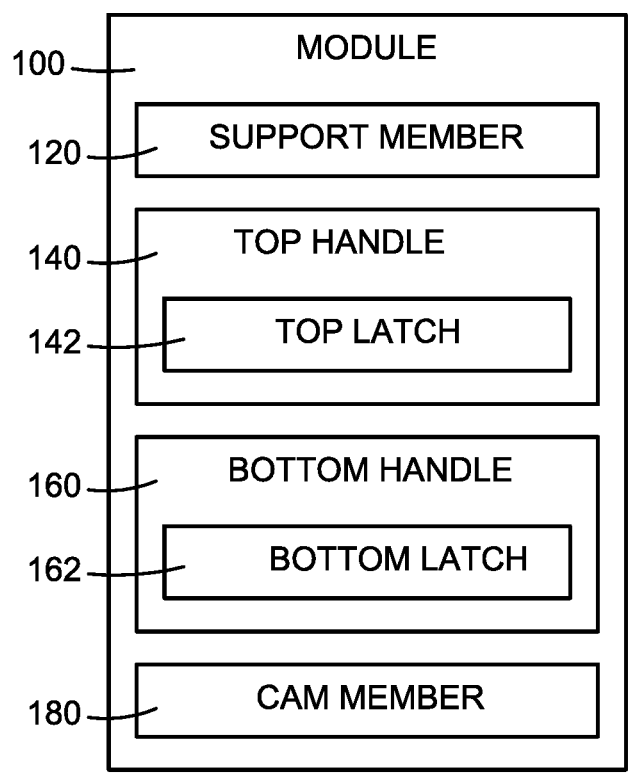
FIG. 1 illustrates a block diagram of a module according to an example.

FIG. 1 illustrates a block diagram of a module 100 according to an example. The module 100 includes a support member 120, a top handle 140, a bottom handle 160, and a cam member 180. The support member 120 to receive an electronic component.

The top handle 140 to rotate between a top closed position and a top open position. In the top closed position, a top latch 142 holds the top handle 140 in a top closed position. In the top open position, the top handle 140 rotates a first amount to a top open position. Rotation of the top handle 140 to rotate the electronic component a second amount to provide access to the electronic component.

The bottom handle 160 to rotate between a bottom closed position and a bottom open position. In the bottom closed position, a bottom latch 162 holds the bottom handle 160 in a bottom closed position. In the bottom open position, the bottom handle 160 rotates the first amount to a bottom open position. Rotation of the bottom handle 160 to rotate the electronic component the second amount to provide access to the electronic component.

The cam member 180 to engage with the top handle 140 and the bottom handle 160 to control rotation of the top handle 140, bottom handle 160, and the electronic component.

Figure 2:
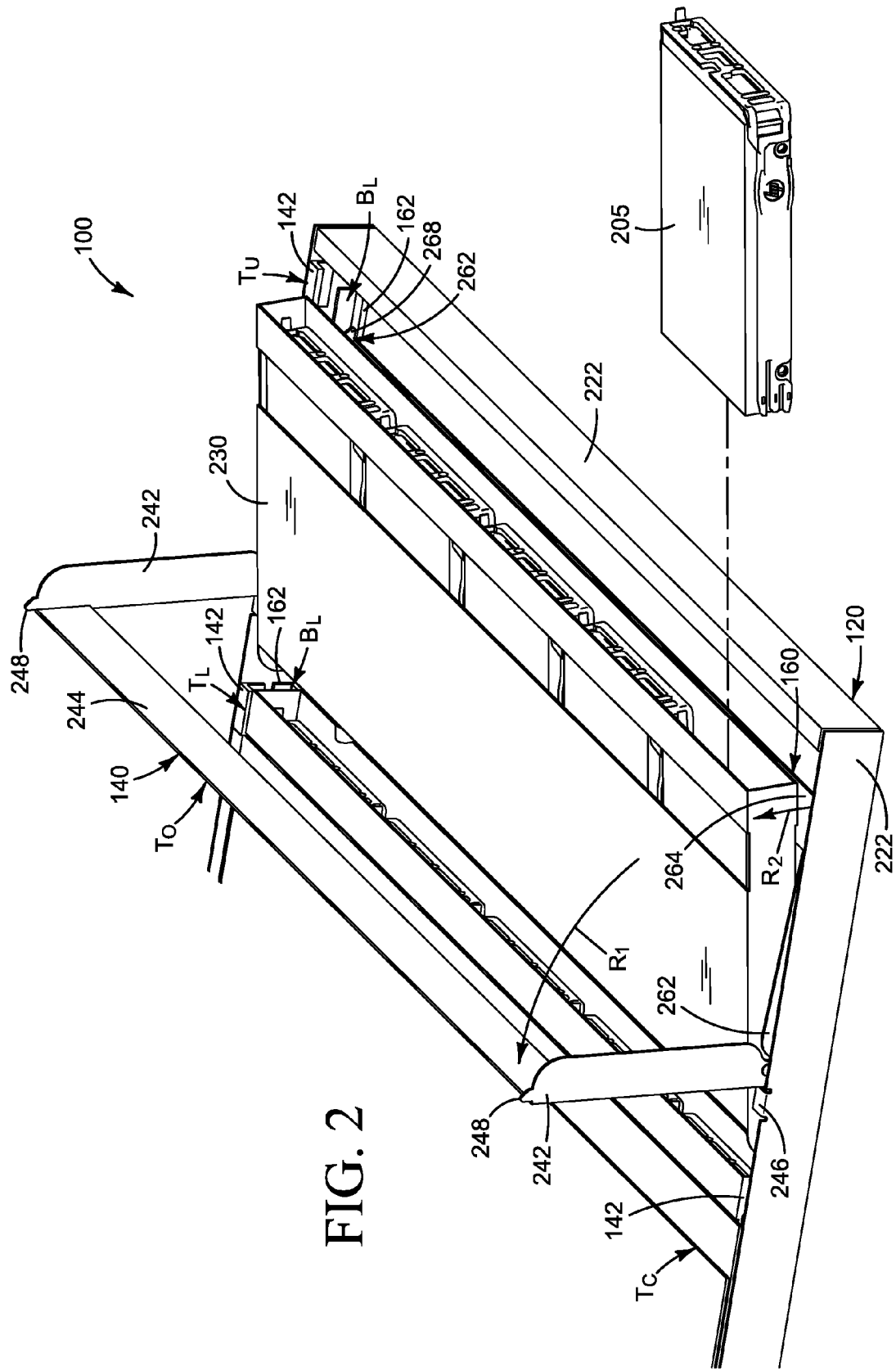
FIGS. 2-10 illustrate perspective views of the module of FIG. 1 according to an example.
Figure 3:
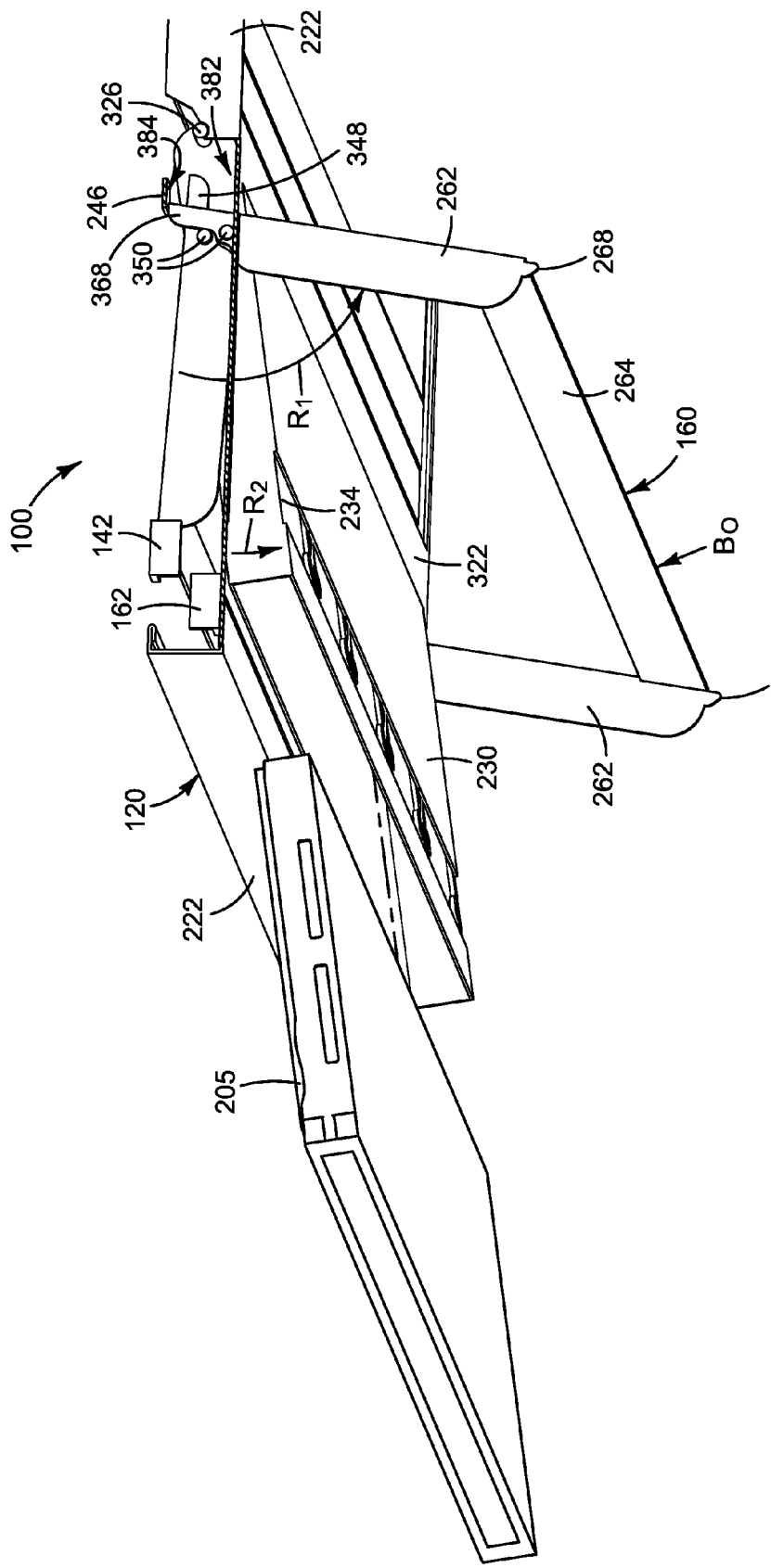

FIGS. 2-10 illustrate perspective views of the module of FIG. 1 according to an example. Referring to FIGS. 2-3, an example of the module 100 is illustrated. The module 100 includes the support member 120 to receive an electronic component 205. The support member 120 includes a set of perimeter walls 222. FIG. 3 further illustrates the support member 120 including at least one support wall 322 extending between the set of perimeter walls 222. The support member 120 may also have a cage 230 connected thereto to receive the electronic component 206.

Referring to FIG. 2, the top handle 140 is illustrated to include a pair of top arms 242 and a top handle bar 244 formed between the pair of top arms 242. Similarly, the bottom handle 160 includes a pair of bottom arms 262 and a bottom handle bar 264 formed between the pair of bottom arms 262. The top latch 142, the bottom latch 162, and a top handle stop 246 are also illustrated in FIG. 2.

FIG. 2 illustrates the module 100 including a plurality of electronic components 205, for example, five. The electronic components 205 illustrated include, for example, hot-pluggable hard disk drives; however, other electronic components may be included, such as modular servers or data storage devices. The top handle 140 and the bottom handle 160 extend across at least one of the electronic components 205 and are illustrated extending over the plurality of electronic components 205. Alternatively, each electronic component 205 may include a separate handle extending thereacross.

The module 100 illustrates the top handle 140 in both the top closed position $T_C$ with the top latch 142 in the top locked position $T_L$ and the top open position $T_O$ with the top latch 142 in a top unlocked position $T_U$. A portion of the bottom handle 160 is visible in FIG. 2. The bottom handle 160 is illustrated in the bottom closed position $B_C$ with the bottom latch 162 in the bottom locked position $B_L$. The bottom handle 160 is further illustrated in FIG. 3.

FIG. 3 illustrates the module 100 with a single electronic component, such as a hot-pluggable sever module. The top handle 140 illustrated with the top handle 140 in the top closed position $T_C$ with the top latch 142 in the top locked position $T_L$. Each top arm of the pair of arms 242 is connected to the top handle bar 244 at one end and is connected to the cage 230 at an opposite end. Each top arm includes a top protrusion 248 at the one end to engage with the top latch 142. Each top arm comprises a top lever 348, extending from the opposite end. The top lever 348 to engage the top cam surface 382.

The bottom handle 160 is illustrated in the bottom open position $B_O$ with the bottom latch 162 in the bottom unlocked position $B_U$. Each bottom arm of the pair of bottom arms 262 is connected to the bottom handle bar 264 at one end and is connected to the cage 230 at an opposite end. Each bottom arm includes a bottom protrusion 268 at the one end to engage with the bottom latch 162. Each bottom arm comprises a bottom lever 368, extending from the opposite end. The bottom lever 368 to engage the bottom cam surface 384. A pair of fasteners 350 are also illustrated to secure the top handle 140 and the bottom handle 160 to the support member 120 and/or the cage 230. The cage 230 may be rotatably connected to the support member 120 via a rod 326 or other fastening member that enables rotation of the cage 230 about an axis.

As illustrated in FIGS. 2-3, the motion of the top handle 140 and the bottom 160 controls access to the electronic components 205. The motion of the module 100 is controlled by rotation of one of the top handle 140 or the bottom handle 160 between the top and bottom open and closed positions, respectively. The cam member 180 engages with the top handle 140 and the bottom handle 160 to control rotation of the top handle 140, bottom handle 160, and the electronic component. The motion of the module 100 is further illustrated in FIGS. 4-10.

Figure 4:
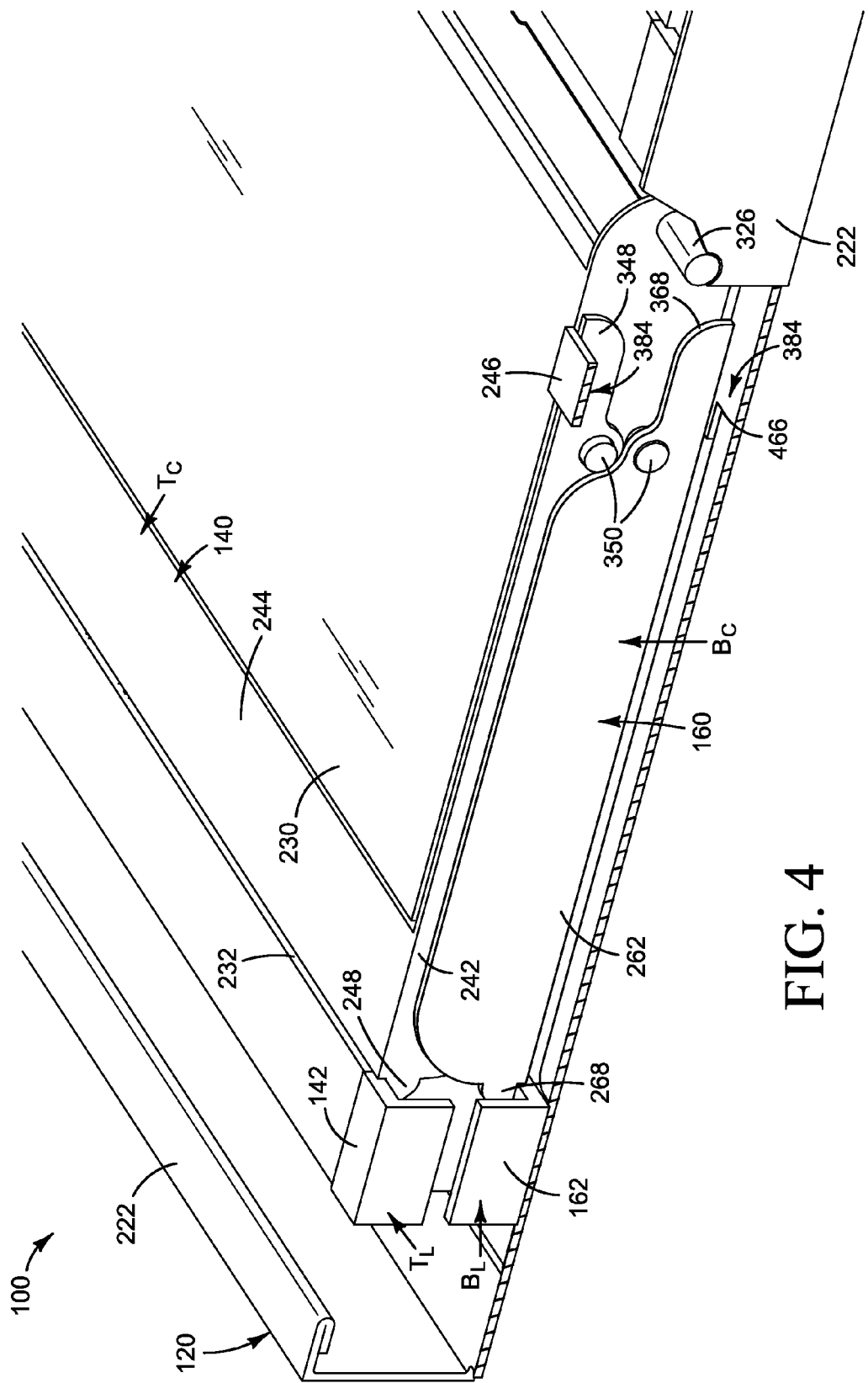

FIG. 4 illustrates the module 100 locked or in a position where there is no access to the electronic components 205. In this position, the module 100 may be inserted into a rack and/or in use by the computing system. In particular, the top handle 140 is in the top closed position $T_C$ with the top latch 142 in the top locked position $T_L$, and the bottom handle 160 is in the bottom closed position $B_C$ with the bottom latch 162 in the bottom locked position $B_L$. In the top closed position $T_C$, the top latch 142 holds the top handle 140 in the top closed position $T_C$. In the bottom closed position $B_C$, the bottom latch 162 holds the bottom handle 160 in the bottom closed position $B_C$. Moreover, the handles may be formed to lie flush with the cage 230 to save space. For example, the cage 230 may include a top cut out 232 that is formed to receive the top handle 140. The cage 230 may further include a bottom cut out 234 that is formed to receive the bottom handle 160. The top and bottom cut outs 232, 234 are further illustrated in FIGS. 6, 7, and 10.

Figure 5:
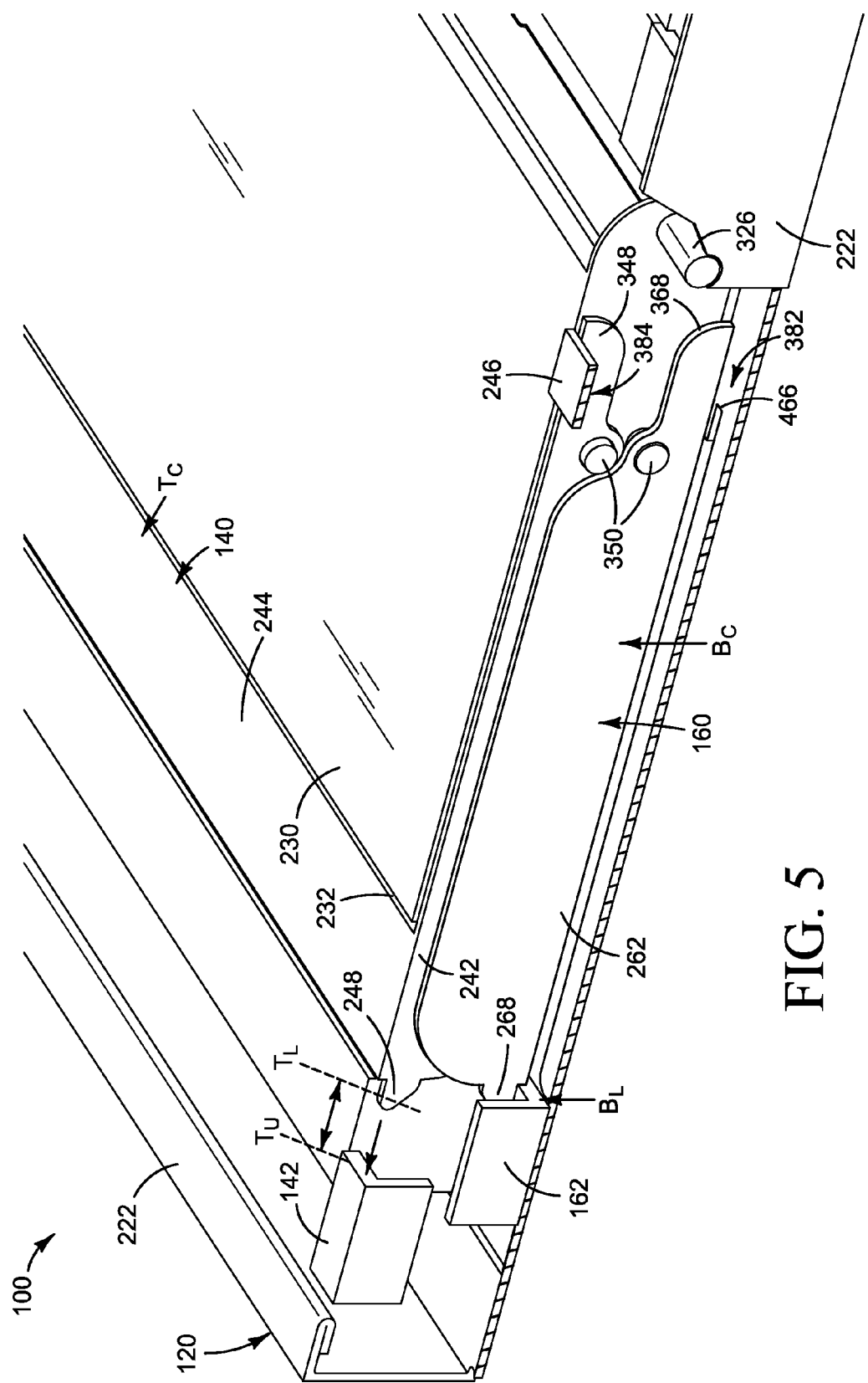

Referring to FIG. 5, the top latch 142 moves to the top unlocked position $T_U$. The top handle 140 is illustrated in the top closed position $T_C$. The bottom handle 160 remains in the bottom closed position $B_C$ with the bottom latch 162 in the bottom locked position $B_L$.

Figure 6:
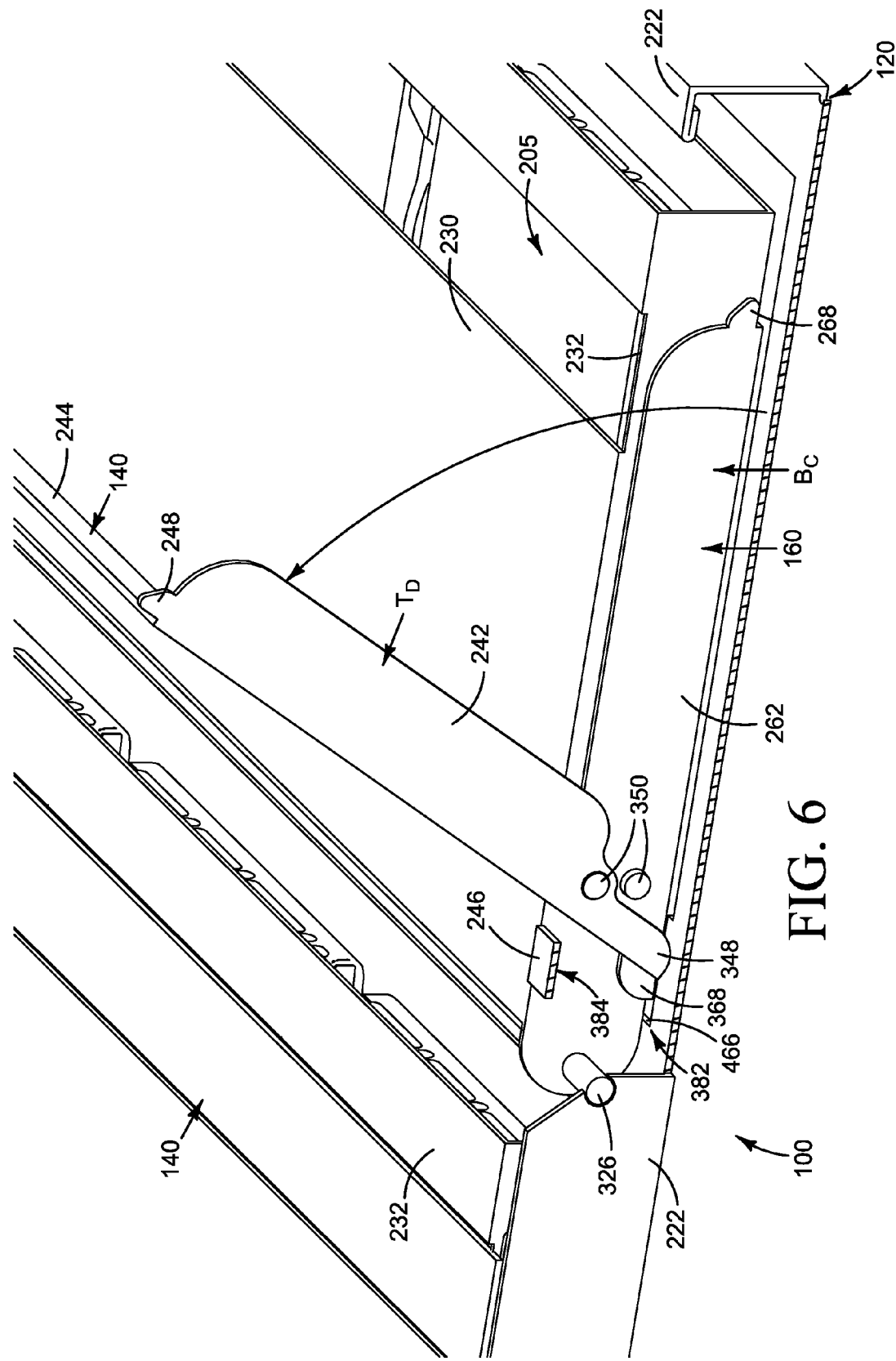

FIG. 6 illustrates the top handle 140 rotating from the top closed position $T_C$ towards the top open position $T_O$ with the top latch 142 in the top unlocked position $T_U$. The top handle 140 is in a displaced position $T_D$. The top handle 140 may rotate when a force is applied to "release the handle." For example, the force may be from a user that lifts the handle or from a spring when the top handle 140 is spring loaded. As the top handle 140 rotates the top lever 348 engages with the top cam surface 382. The top cam surface 382 provides a conic surface to change the rate of movement of two distinct planes, the plane of the handle 140 and the plane of the cage 230 and/or electronic component 205.

Figure 7:
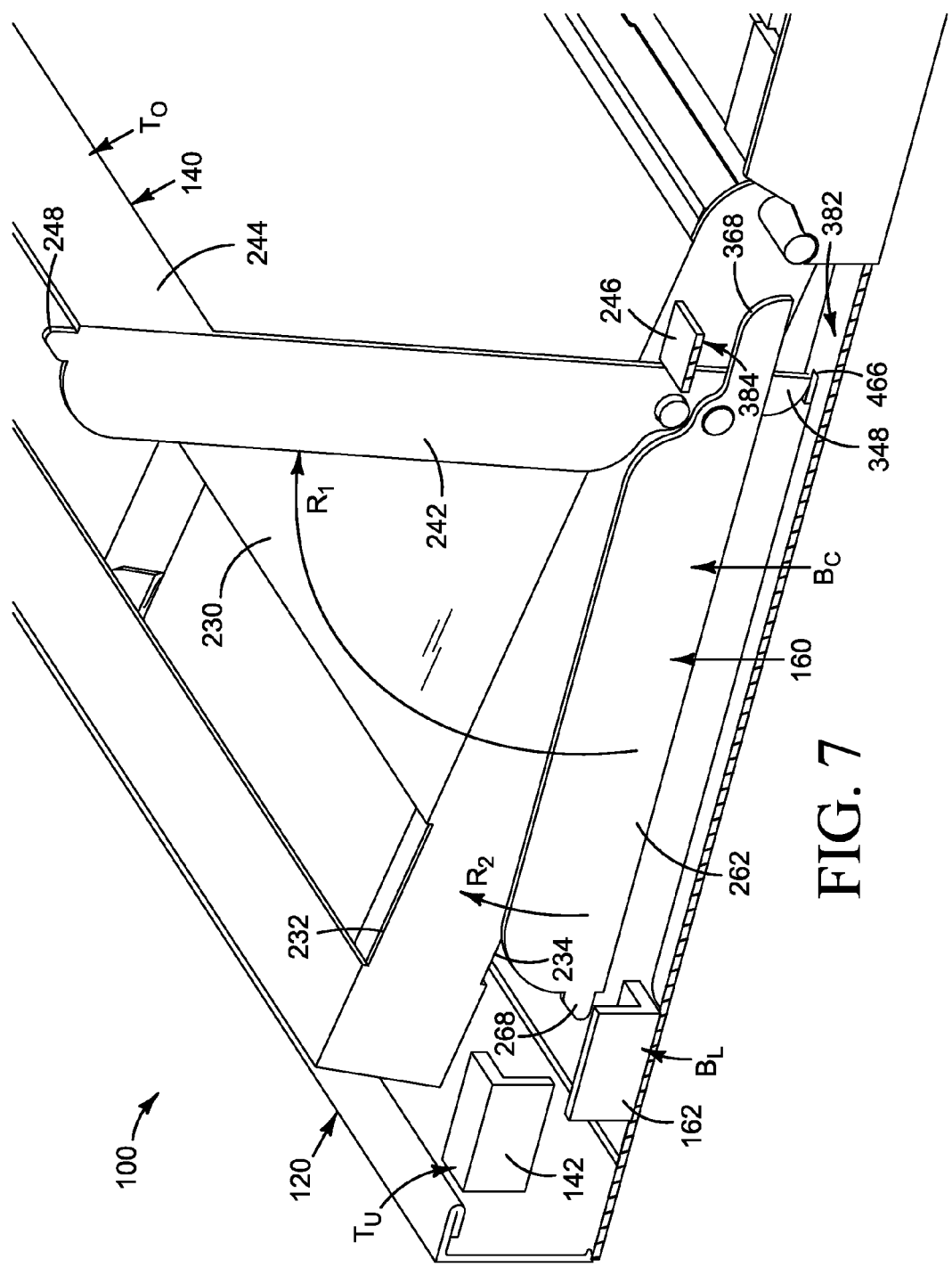

Referring to FIG. 7, the top handle 140 is illustrated in the open top position $T_O$. In the open top position $T_O$, the top handle 140 rotates a first amount $R_1$ to a top open position $T_O$. In the top open position $T_O$, the top handle 140 contacts or engages with a top handle stop 246 to control rotation or stop the rotation of the top handle 140. Rotation of the top handle 140 to rotate the electronic component 205 a second amount $R_2$ to provide access to the electronic component 205. The cam member 180 is used to rotate the first amount $R_1$ along a first plane and the second amount $R_2$ along a second plane, where the first amount $R_1$ and the second amount $R_2$ are distinct. For example, the first amount $R_1$ may be ninety degrees and the second amount $R_2$ may be ten degrees.

In the top open position $T_O$, the electronic component 205 is accessible for repair or replacement. Once access to the electronic component 205 is not desired, the top handle 140 may be rotated from the top open position $T_O$ to the top closed position $T_C$. From the top closed position $T_C$, the module 100 may then return to the closed position as illustrated in FIG. 4 with the top latch 142 in the top locked position $T_L$. In the closed position or in a position where there is no access to the electronic components 205, the electronic components may be inserted into a rack for use.

Figure 8:
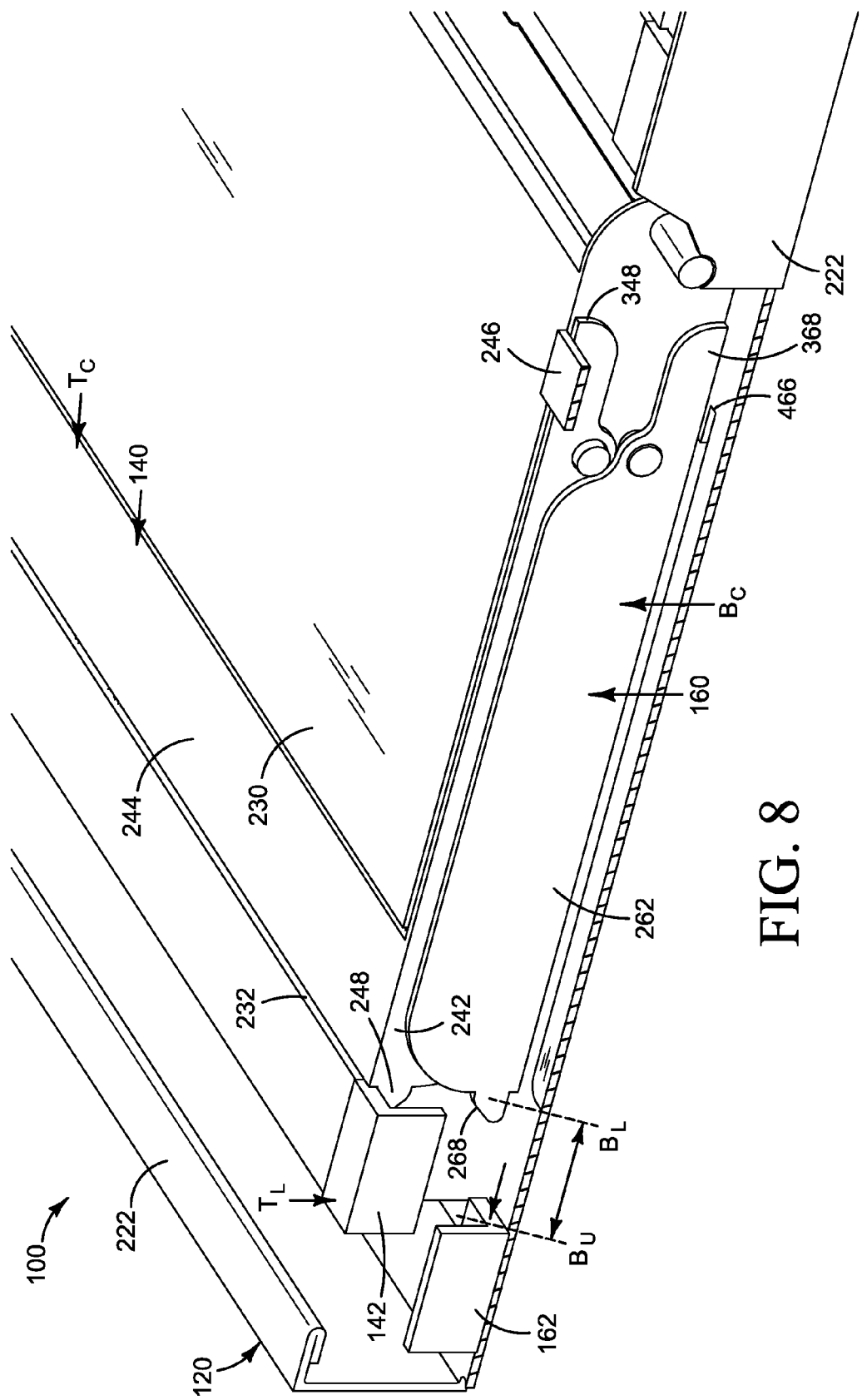

In FIG. 8, the bottom latch 162 moves from the bottom locked position $B_L$ to the bottom unlocked position $B_U$. The bottom handle 160 is illustrated in the bottom closed position $B_C$. The top handle 140 remains in the top closed position $T_C$ with the top latch 142 in the top locked position $T_L$.

Figure 9:
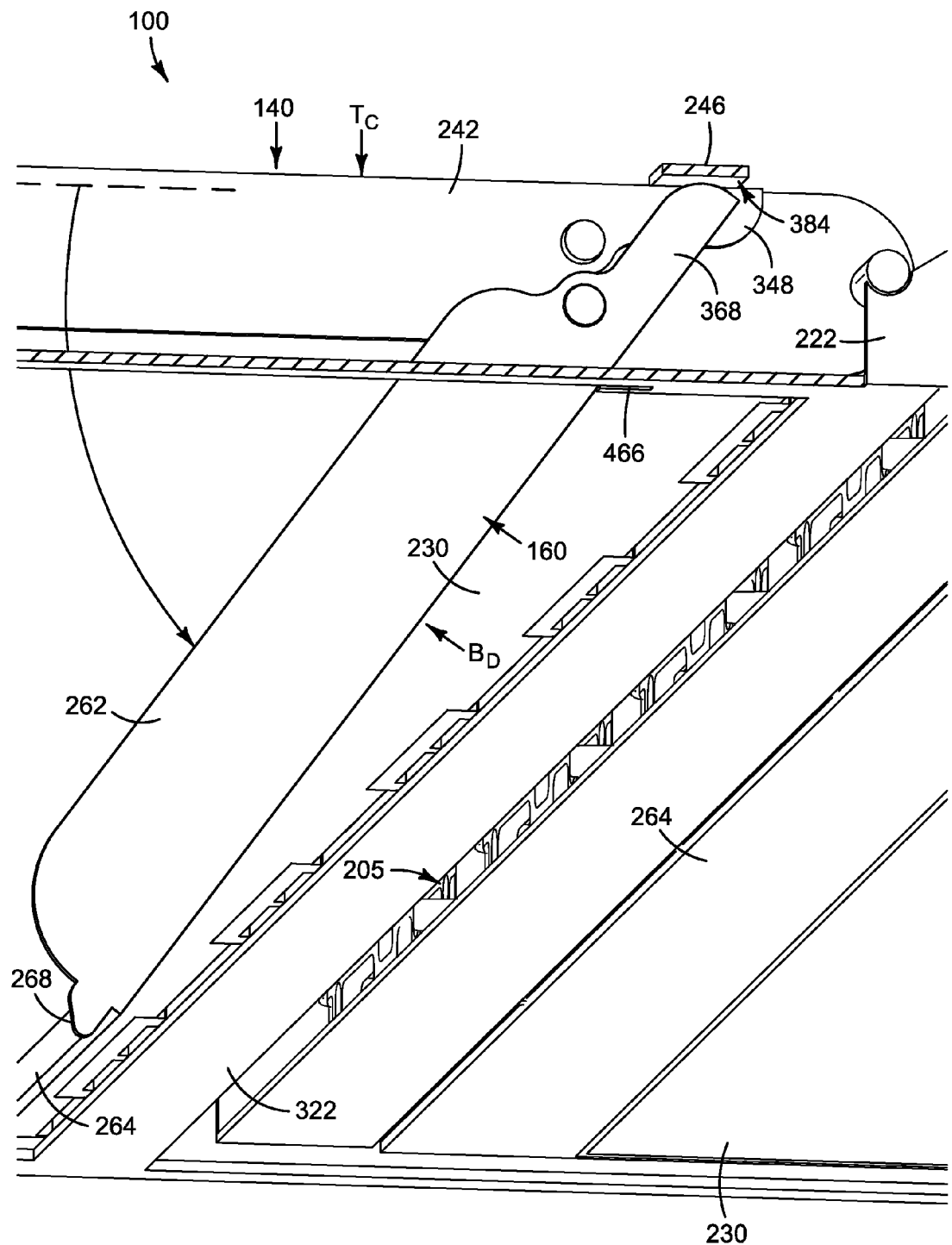

FIG. 9 illustrates the bottom handle 160 rotating from the bottom closed position $B_C$ towards the bottom open position $B_O$ with the bottom latch 162 in the bottom unlocked position $B_U$. The bottom handle 160 is in a displaced position $B_D$. The bottom handle 160 may rotate when a force is applied to "release the handle." For example, the force may be from gravity, a user that pulls the handle, or a spring when the bottom handle 160 is spring loaded. As the bottom handle 160 rotates the bottom lever 368 engages with the bottom cam surface 384. The bottom cam surface 384 provides a conic surface to change the rate of movement of two distinct planes, the plane of the bottom handle 160 and the plane of the cage 230 and/or electronic component 205.

Figure 10:
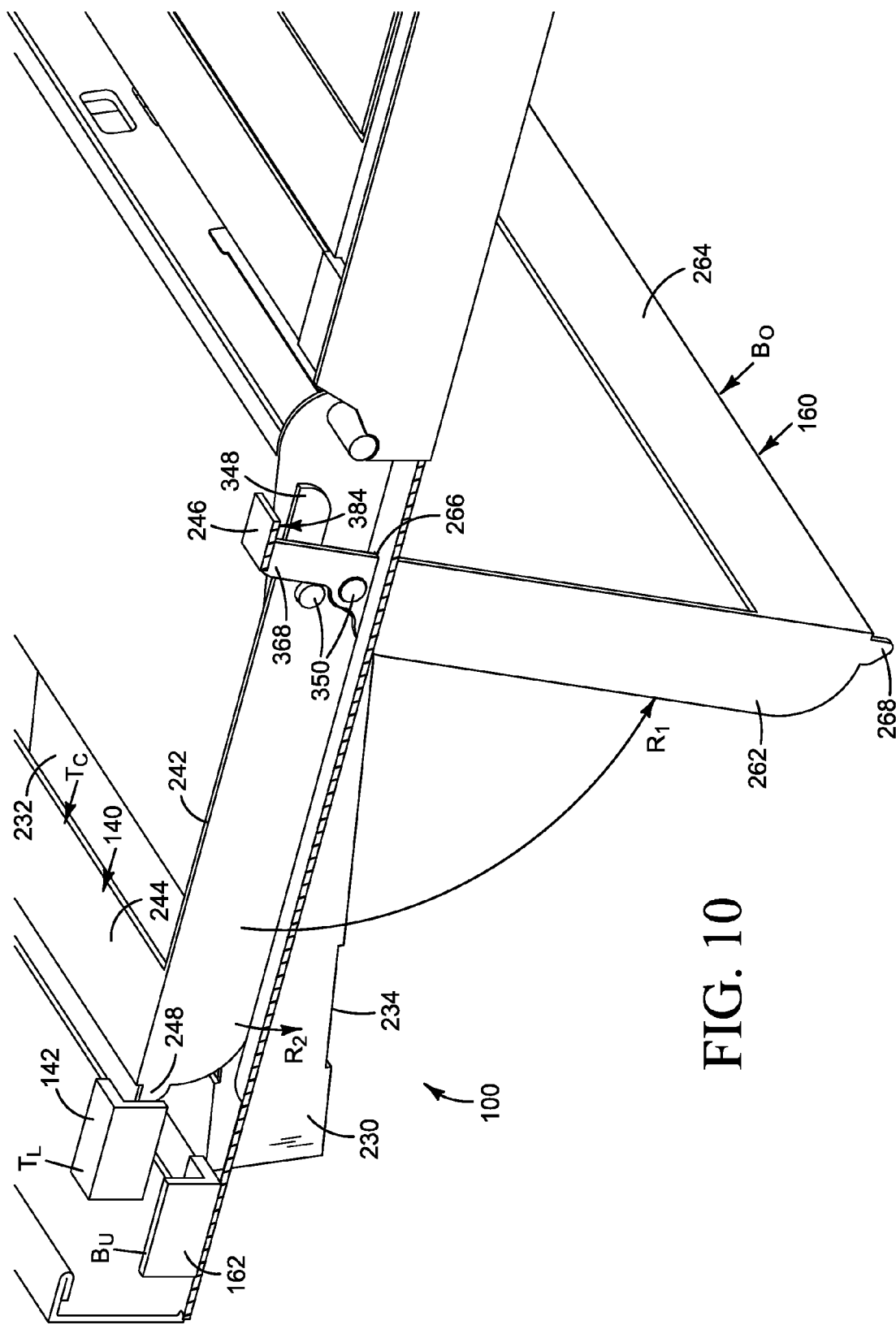

Referring to FIG. 10, the bottom handle 160 is illustrated in the bottom open position $B_O$. In the bottom open position $B_O$, the bottom handle 160 rotates the first amount $R_1$ to the bottom open position $B_O$. In the bottom open position $B_O$, the bottom handle 160 contacts or engages with a bottom handle stop 466. Rotation of the bottom handle 160 to rotate the electronic component 205 the second amount $R_2$ to provide access to the electronic component 205. The cam member 180 is used to rotate the first amount $R_1$ along a first plane and the second amount $R_2$ along a second plane, where the first amount $R_1$ and the second amount $R_2$ are distinct. For example, the first amount $R_1$ may be ninety degrees and the second amount $R_2$ may be ten degrees.

In the bottom open position $B_O$, the electronic component 205 is accessible for repair or replacement. Once access to the electronic component 205 is not desired, the bottom handle 160 may be rotated from the bottom open position $B_O$ to the bottom closed position $B_C$. From the bottom closed position $B_C$, the module 100 may then return to the closed position as illustrated in FIG. 4 with the bottom latch 162 in the bottom locked position $B_L$. In the closed position or in a position where there is no access to the electronic components 205, the electronic components 205 may be inserted into a rack for use.

Figure 11:
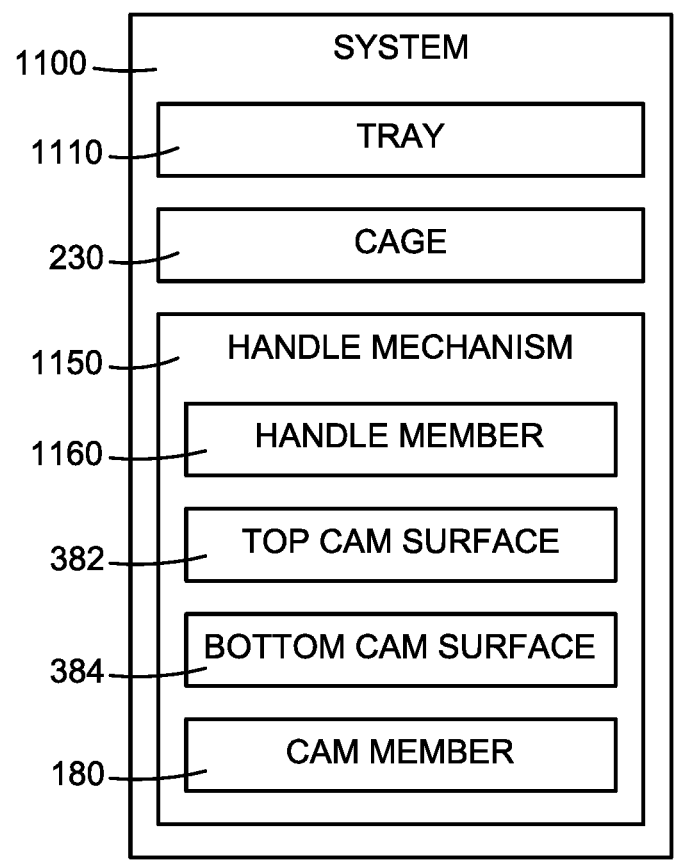
FIG. 11 illustrates a block diagram of a system according to an example.

FIG. 11 illustrates a block diagram of a system 1100 according to an example. The system 1100 includes a tray 1110, a cage 230, and a handle mechanism 1150. The tray 1110 to hold an electronic component 205. The cage 230 connected to the tray 1110 to receive the electronic component 205.

The handle mechanism 1150 to control access to the electronic component. The handle mechanism 1150 includes a handle member 1160 and a cam member 180. The handle member 1160 formed to rotate between a closed position, a top open position, and a bottom open position. In the closed position, a handle latch holds the handle in the closed position. For example, the handle latch may include a top latch 142 and/or a bottom latch 162. In the top open position, the handle rotates a first amount $R_1$ to a top open position and engages with a top cam surface 382. Rotation of the handle member 1160 to rotate the cage 230 a second amount $R_2$. In the bottom open position, the handle member 1160 rotates the first amount $R_1$ to a bottom open position and engages with a bottom cam surface 384. Rotation of the handle member 1160 to rotate the cage 230 the second amount $R_2$. The cam member 180 to control a rate of rotation of the handle member 1160 and the cage 230.

Figure 12:
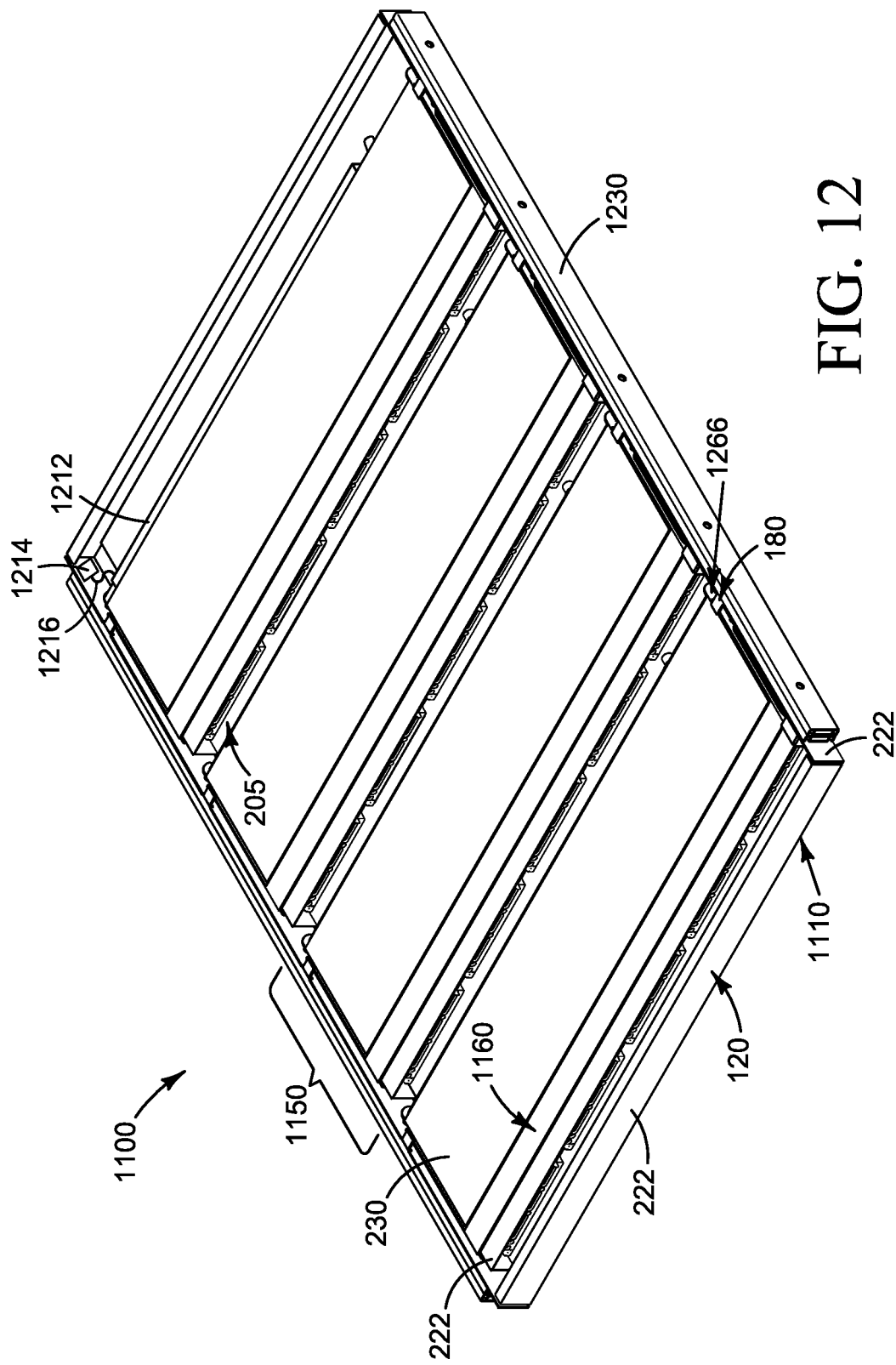
FIGS. 12-15 illustrate perspective views of the system of FIG. 11 according to examples.
Figure 13:
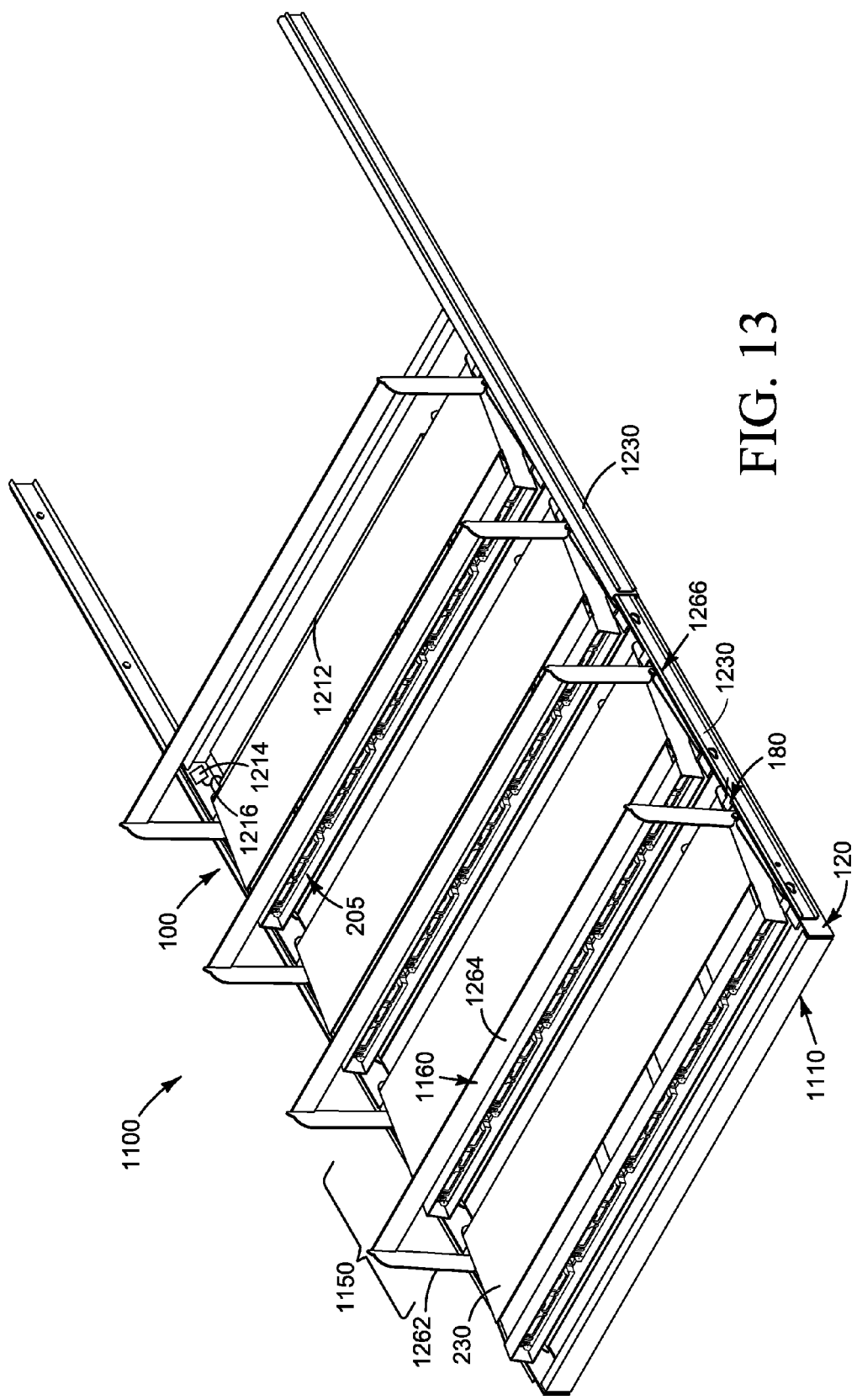

FIGS. 12-15 illustrate perspective views of the system of FIG. 11 according to examples. Referring to FIGS. 12-13, an example of the system 1100 is illustrated including the tray 1110, the cage 230, and the handle mechanism 1150. For example, the tray 1110 as illustrated is formed of a support member 120 with perimeter walls 222 and at least one support wall 322.

The system 1100 may further include a backplane 1212 connected to each cage 230 and formed to rotate with the cage 230. The backplane 1212 is connected to a printed circuit assembly 1214 that may be formed in the tray 1110, such as along at least one perimeter wall 222. The printed circuit assembly 1214 to connect to the backplane 1212 via a cable 1216 that is flexible and formed to rotate with the backplane 1212.

The system 1100 may also include a rack. The tray 1110 to connect to the rack via a rail member 1230 that is formed to receive the tray 1110. For example, the rail member 1230 is formed to slide into and out of a rack using ball bearings. FIG. 12 illustrates the rail member 1230 as it would appear when it is in the rack. FIG. 13 illustrates the rail member 1230 separated as it would appear when the tray 1110 is removed from the rack.

The cage 230 includes a slot for at least one electronic component. The handle mechanism 1150 to extend across one cage 230 as illustrated in FIG. 13 or a plurality of cages 230 as illustrated in FIG. 12. The configuration depends on the configuration of the tray 1110 and/or electronic components 205.

The handle mechanism 1150 illustrated includes the handle member 1160 and the cam member 180. The handle member 1160 includes a pair of arms 1262 and a bar 1264 between the pair of arms 1262. Each arm of the pair of arms 1262 is connected to the bar 1264 at one end and is connected to the cage 230 at an opposite end. Each arm includes a lever 1266 extending from the opposite end. The lever 1266 to engage the top cam surface 382 and the bottom cam surface 384. The lever 1266 is further illustrated below in FIGS. 14-15. The handle member 1160 in the examples includes two handles; however, a single handle may also be used. The single handle would have the ability to open towards the top, i.e., $T_O$, and open towards the bottom, i.e., $B_O$, similar to the two separate handles illustrated herein.

Figure 14:
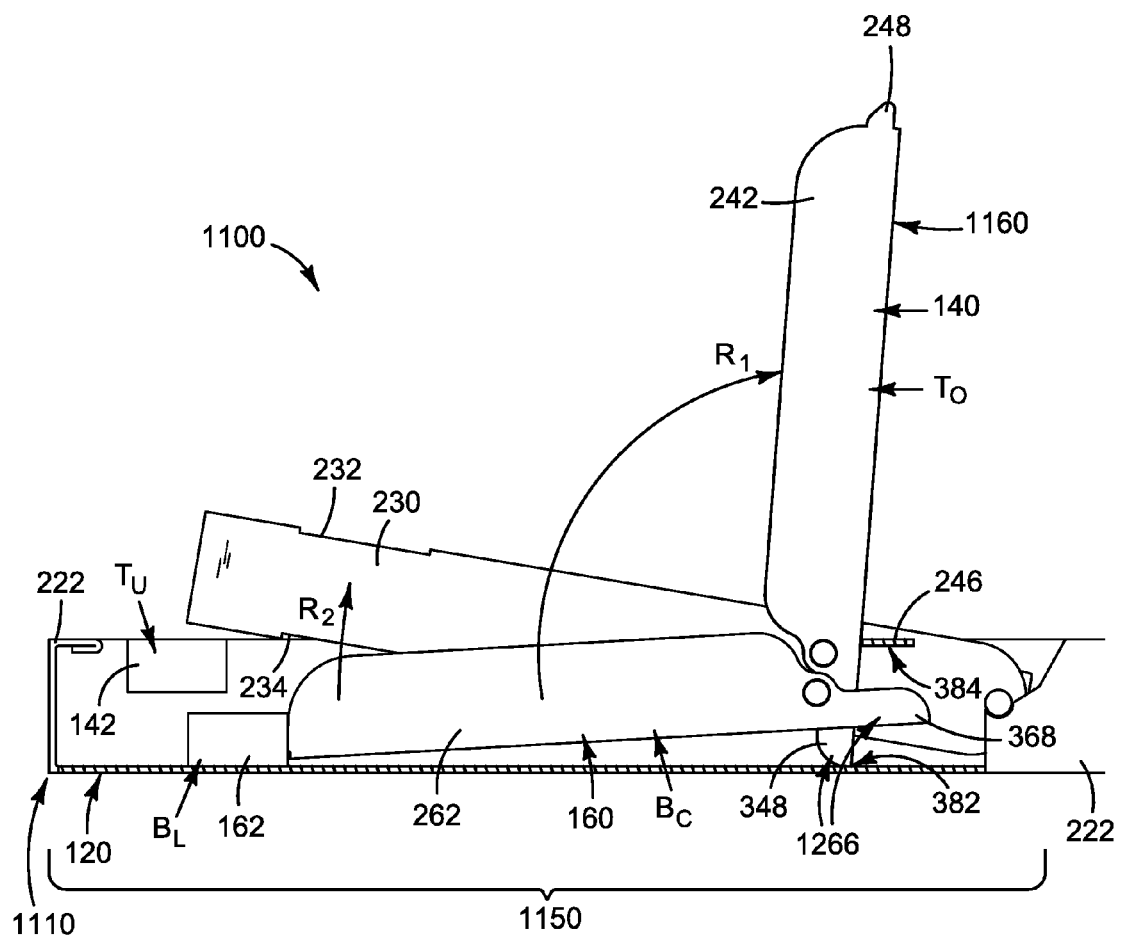
Figure 15:
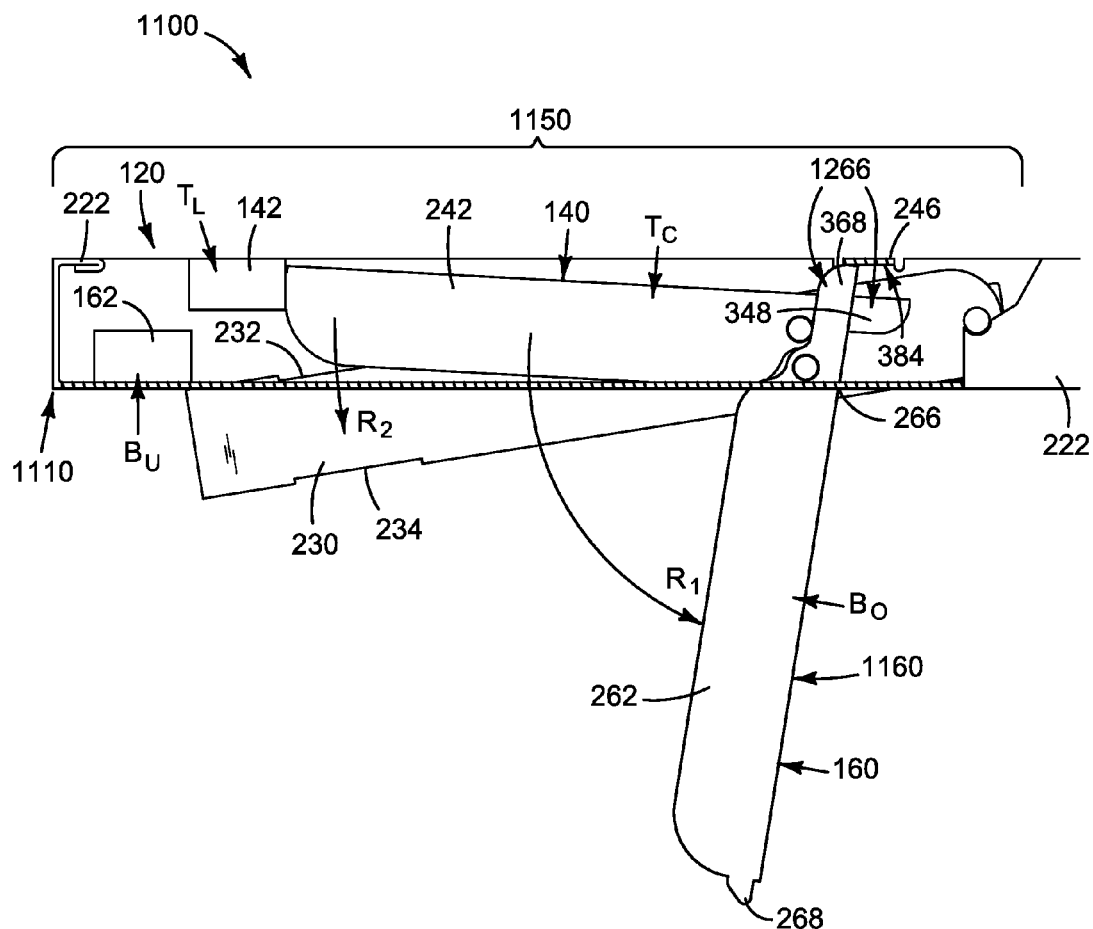

FIGS. 14-15 illustrate side views of the handle mechanism 1150 in the open positions with the electronic component 205 accessible. FIGS. 14-15 illustrate the handle mechanism 1150 as a top handle 140 and a bottom handle 160. FIG. 14 illustrates the top handle 140 in the open top position $T_O$. In the open top position $T_O$, the top handle 140 rotates a first amount $R_1$ to a top open position $T_O$. In the top open position $T_O$, the top handle 140 engages with a top cam surface 382 until the top handle 140 contacts a top handle stop 246, which control rotations or stops rotation at the top handle stop 246. Rotation of the top handle 140 to rotate the cage 230 a second amount $R_2$ to provide access to the electronic component 205. The cam member 180 is used to rotate the first amount $R_1$ along a first plane and the second amount $R_2$ along a second plane, where the first amount $R_1$ and the second amount $R_2$ are distinct. For example, the first amount $R_1$ may be ninety degrees and the second amount $R_2$ may be ten degrees.

In the top open position $T_O$, the electronic component 205 is accessible for repair or replacement. Once access to the electronic component 205 is not desired, the top handle 140 may be rotated from the top open position $T_O$ to the top closed position $T_C$. From the top closed position $T_C$, the module 100 may then return to the closed position as illustrated in FIG. 4 with the bottom latch 162 in the locked position $B_L$. In the closed position or in a position where there is no access to the electronic components 205, the tray 1110 may be inserted into a rack for use.

Referring to FIG. 15, the bottom handle 160 is illustrated in the bottom open position $B_O$. In the bottom open position $B_O$, the bottom handle 160 rotates the first amount $R_1$ to the bottom open position $B_O$. In the bottom open position $B_O$, the bottom handle 160 engages with a bottom cam surface 384 until the bottom handle 160 contacts a bottom handle stop 466, which control rotations or stops rotation at the bottom handle stop 466. Rotation of the bottom handle 160 to rotate the cage 230 the second amount $R_2$ to provide access to the electronic component 205. The cam member 180 is used to rotate the first amount $R_1$ along a first plane and the second amount $R_2$ along a second plane, where the first amount $R_1$ and the second amount $R_2$ are distinct. For example, the first amount $R_1$ may be ninety degrees and the second amount $R_2$ may be ten degrees.

In the bottom open position $B_O$, the electronic component 205 is accessible for repair or replacement. Once access to the electronic component 205 is not desired, the bottom handle 160 may be rotated from the bottom open position $B_O$ to the bottom closed position $B_C$. From the bottom closed position $B_C$, the module 100 may then return to the closed position as illustrated in FIG. 4 with the bottom latch 162 in the bottom locked position BL. In the closed position or in a position where there is no access to the electronic components 205 the electronic components may be inserted into a rack for use.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A module comprising:
a support member to receive an electronic component;
a top handle to rotate between a top closed position and a top open position,
in the top closed position, a top latch holds the top handle in the top closed position, and
in the top open position, the top handle rotates a first amount to the top open position, rotation of the top handle to rotate the electronic component a second amount to provide access to the electronic component;
a bottom handle to rotate between a bottom closed position and a bottom open position,
in the bottom closed position, a bottom latch holds the bottom handle in the bottom closed position, and
in the bottom open position, the bottom handle rotates the first amount to the bottom open position, rotation of the bottom handle to rotate the electronic component the second amount to provide access to the electronic component; and
a cam member to engage with the top handle and the bottom handle to control rotation of the top handle, bottom handle, and the electronic component.

2. The module of claim 1, further comprising a top cam surface to engage with the top handle and a bottom cam surface to engage with the bottom handle.

3. The module of claim 1, wherein the top handle further comprises a pair of top arms and a top handle bar formed between the pair of top arms, and the bottom handle further comprises a pair of bottom arms and a bottom handle bar formed between the pair of bottom arms.

4. The module of claim 1, wherein the support member comprises a set of perimeter walls.

5. The module of claim 4, wherein the support member further comprises at least one support wall extending between the set of perimeter walls.

6. The module of claim 1, wherein the top handle and the bottom handle are spring loaded.

7. The module of claim 1, wherein the cam member rotates the first amount along a first plane and the second amount along a second plane.

8. A system comprising:
a tray to hold an electronic component;
a cage connected to the tray to receive the electronic component; and
a handle mechanism to control access to the electronic component, the handle mechanism including:
a handle member formed to rotate between a closed position, a top open position, and a bottom open position,
in the closed position, a handle latch holds the handle member closed position,
in the top open position, the handle member rotates a first amount to the top open position and engages with a top cam surface, rotation of the handle member to rotate the cage a second amount, and
in the bottom open position the handle member rotates the first amount to the bottom open position and engages with a bottom cam surface, rotation of the handle member to rotate the cage the second amount;
a cam member to control a rate of rotation of the handle member and the cage.

9. The system of claim 8, wherein the cage comprises a slot for at least one electronic component.

10. The system of claim 8, wherein the handle member includes a pair of arms and a bar between the pair of arms.

11. The system of claim 10, wherein each arm of the pair of arms is connected to the bar at one end and connect to the cage at an opposite end, each arm comprises a lever, extending from the opposite end, the lever to engage the top cam surface and the bottom cam surface.

12. The system of claim 8, further comprising a backplane connected to the cage.

13. The system of claim 12, further comprising a printed circuit assembly formed along the tray, the printed circuit assembly to connect to the backplane via a cable.

14. The system of claim 8, wherein the first amount and the second amount are distinct.

15. The system of claim 8, further comprising a top handle stop and a bottom handle stop to engage with the handle member and control rotation.

* * * * *